United States Patent
Kusumoto

(10) Patent No.: US 11,387,051 B2
(45) Date of Patent: Jul. 12, 2022

(54) SOLAR CELL

(71) Applicant: Panasonic Intellectual Property Management Co., Ltd., Osaka (JP)

(72) Inventor: Shohei Kusumoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 407 days.

(21) Appl. No.: 16/366,277

(22) Filed: Mar. 27, 2019

(65) Prior Publication Data

US 2019/0362905 A1 Nov. 28, 2019

(30) Foreign Application Priority Data

May 25, 2018 (JP) .............................. JP2018-100793

(51) Int. Cl.
*H01G 9/20* (2006.01)
*H01L 51/42* (2006.01)
*H01L 51/00* (2006.01)
*H01L 51/44* (2006.01)
*H01L 51/50* (2006.01)

(52) U.S. Cl.
CPC ......... *H01G 9/2059* (2013.01); *H01G 9/2031* (2013.01); *H01L 51/0003* (2013.01); *H01L 51/0032* (2013.01); *H01L 51/4213* (2013.01); *H01L 51/441* (2013.01); *H01L 51/508* (2013.01); *H01L 2251/306* (2013.01)

(58) Field of Classification Search
CPC .............. H01G 9/2059; H01G 9/2031; H01L 51/4213; H01L 51/441; H01L 51/0032; H01L 51/508; H01L 2251/306
See application file for complete search history.

(56) References Cited

U.S. PATENT DOCUMENTS

| | | | |
|---|---|---|---|
| 2018/0005762 A1* | 1/2018 | Zhu ...................... | H01G 9/2059 |
| 2018/0019066 A1* | 1/2018 | Hayakawa ........... | H01G 9/2009 |
| 2018/0247769 A1* | 8/2018 | Qi ........................ | C23C 14/0694 |

OTHER PUBLICATIONS

Lv, Minghang, et al. "Performance Enhancement of Perovskite Solar Cells with a Modified TiO2 Electron Transport Layer Using Zn-Based Additives." Royal Society of Chemistry Advances, vol. 6, Mar. 31, 2016, pp. 35044-35050. (Year: 2016).*

(Continued)

*Primary Examiner* — Bethany L Martin
*Assistant Examiner* — Kourtney R S Carlson
(74) *Attorney, Agent, or Firm* — McDermott Will & Emery LLP

(57) ABSTRACT

Provided is a solar cell comprising a first electrode, a second electrode, a light-absorbing layer located between the first electrode and the second electrode, and an electron transport layer located between the first electrode and the light-absorbing layer. At least one electrode selected from the group consisting of the first electrode and the second electrode has light-transmissive property. The light-absorbing layer contains a perovskite compound represented by a chemical formula $ASnX_3$ (where A is a monovalent cation and X is a halogen anion). The electron transport layer contains an electron transport material including Ti and Zn. A difference between energy levels of lower ends of conduction bands of the electron transport material and the perovskite compound is less than 0.42 eV.

6 Claims, 3 Drawing Sheets

(56) References Cited

OTHER PUBLICATIONS

Mulmudi Hemant Kumar et al., "Lead-Free Halide Perovskite Solar Cells with High Photocurrents Realized Through Vacancy Modulation", Advanced Materials 2014, 26, 41, Sep. 11, 2014, pp. 7122-7127.

C. Ye et al., "Preparation and photoluminescence of undoped ZnTiO3 thin films", Journal of Applied Physics 106, 033520(2009), Aug. 13, 2009.

Xiong Yin et al., "Ternary Oxides in the TiO2—ZnO System as Efficient Electron-Transport Layers for Perovskite Solar Cells with Efficiency over 15%", Applied Materials and Interfaces 2016, 8 (43), Oct. 14, 2016, pp. 29580-29587.

Zhixin Wan et al., "Electrical and optical properties of Ti doped ZnO films grown on glass substrate by atomic layer deposition", Materials Research Bulletin 57 (2014) 23-28, Sep. 2014.

Josephine B. M. Goodall et al., "Optical and photocatalytic behaviours of nanoparticles in the Ti—Zn—O binary system", Royal Society of Chemistry Advances, 2014, 4, Jun. 24, 2014, pp. 31799-31809.

* cited by examiner

SOLAR CELL

BACKGROUND

1. Technical Field

The present disclosure relates to a solar cell.

2. Description of the Related Art

Recently, a perovskite solar cell has been researched and developed. In the perovskite solar cell, a perovskite compound represented by a chemical formula $ABX_3$ (where A is a monovalent cation, B is a divalent cation, and X is a halogen anion) is used as a light-absorbing material.

Non-Patent Literature 1 discloses that a perovskite compound represented by the chemical formula $CsSnI_3$ is used as a light-absorbing material of a perovskite solar cell. Furthermore, Non-Patent Literature 1 discloses that $TiO_2$ and an organic semiconductor referred to as Spiro-OMETAD are used as an electron transport material and a hole transport material, respectively.

Non-Patent Literature 2 discloses using $TiO_2$—ZnO ternary oxides as electron transport materials for perovskite solar cells.

CITATION LIST

Non-Patent Literature

Non-Patent Literature 1: Mulmudi Hemant Kumar et al., "Lead-Free Halide Perovskite Solar Cells with High Photocurrents Realized Through Vacancy Modulation", Advanced Materials, 2014 Nov. 26, 41, p. 7122-7127

Non-Patent Literature 2: Xiong Yin et al., "Ternary Oxides in the $TiO_2$—ZnO System as Efficient Electron-Transport Layers for Perovskite Solar Cells with Efficiency over 15%", Applied Materials and Interfaces, 2016 Oct. 8 (43), p. 29580-29587

SUMMARY

An object of the present disclosure is to provide a tin perovskite solar cell in which the conversion efficiency thereof is further improved.

The present disclosure provides a solar cell, comprising:
a first electrode;
a second electrode;
a light-absorbing layer located between the first electrode and the second electrode; and
an electron transport layer located between the first electrode and the light-absorbing layer,
wherein
at least one electrode selected from the group consisting of the first electrode and the second electrode has light-transmissive property;
the light-absorbing layer contains a perovskite compound represented by a chemical formula $ASnX_3$ (where A is a monovalent cation and X is a halogen anion);
the electron transport layer contains an electron transport material including Ti and Zn; and
a difference between energy levels of lower ends of conduction bands of the electron transport material and the perovskite compound is less than 0.42 eV.

The present disclosure provides a tin perovskite solar cell in which the conversion efficiency thereof is further improved.

DETAILED DESCRIPTION OF THE EMBODIMENT

Definition of the Terms

The term "perovskite compound" used in the present specification means a perovskite crystal structure represented by a chemical formula $ABX_3$ (where A is a monovalent cation, B is a divalent cation, and X is a halogen anion) and a structure having a crystal similar thereto.

The term "tin perovskite compound" used in the present specification means a perovskite compound containing tin.

The term "tin perovskite solar cell" used in the present specification means a solar cell including the tin perovskite compound as a light-absorbing material.

(Findings which Established the Foundation of the Present Disclosure)

The findings which established the foundation of the present disclosure will be described below.

Since a tin perovskite compound has an excellent physical property as a light-absorbing material, the tin perovskite compound is expected to have high conversion efficiency. The present inventor focused on matching of energy levels of lower ends of conduction bands of the light-absorbing material and an electron transport material. Hereinafter, the energy level of the lower end of the conduction band is abbreviated to as "conduction band level".

As disclosed in Non-Patent Literature 1, in a conventional tin perovskite solar cell, a typical electron transport material is $TiO_2$. $TiO_2$ is appropriate in terms of the matching of the conduction band level for a perovskite compound including lead (hereinafter, referred to as "lead perovskite compound"). However, $TiO_2$ is not appropriate in terms of the matching of the conduction band level for the tin perovskite compound. In particular, the conduction band level of the tin perovskite compound is shallower than that of the lead perovskite compound by approximately 0.5 eV-0.6 eV. As just described, $TiO_2$ is an appropriate electron transport material for the lead perovskite compound; however, $TiO_2$ is not an appropriate electron transport material for the tin perovskite compound, since the conduction band level of $TiO_2$ is too deep for the tin perovskite compound.

The present disclosure provides a solar cell in which an electron transport material having an appropriate conduction band for the tin perovskite compound is used. The solar cell has higher conversion efficiency than a conventional tin perovskite compound.

Embodiment of the Present Disclosure

Hereinafter, the embodiment of the present disclosure will be described with reference to the drawings.

Figure 1:
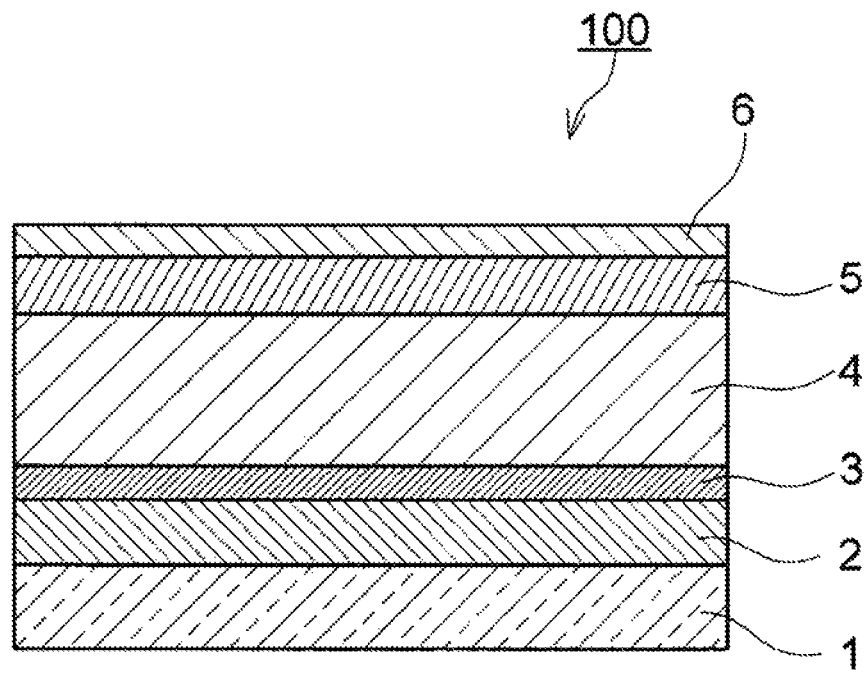
FIG. 1 shows a cross-sectional view of a solar cell according to the embodiment of the present disclosure.

FIG. 1 shows a cross-sectional view of a solar cell 100 according to the present embodiment. As shown in FIG. 1, the solar cell 100 according to the present embodiment comprises a first electrode 2, a second electrode 6, a light-absorbing layer 4, and an electron transport layer 3. The light-absorbing layer 4 is located between the first electrode 2 and the second electrode 6. The electron transport layer 3 is located between the first electrode 2 and the light-absorbing layer 4. The first electrode 2 faces the second electrode 6 in such a manner that the electron transport layer 3 and the light-absorbing layer 4 are disposed between the first electrode 2 and the second electrode 6. At least one electrode selected from the group consisting of the first electrode 2 and the second electrode 6 has light-transmissive property. In the present specification, "the electrode has light-transmissive property" means that 10% or more of light having a wavelength of not less than 200 nanometers and not more than 2,000 nanometers travels through the electrode at any wavelength.

The light-absorbing layer 4 contains a perovskite compound represented by a chemical formula $ASnX_3$ (where A is a monovalent cation and X is a halogen anion) as the light-absorbing material. The monovalent cation located at the A site is not limited. An example of the monovalent cation is an organic cation or an alkali metal cation. An example of the organic cation is a methylammonium cation (i.e., $CH_3NH_3^+$), a formamidinium cation (i.e., $NH_2CHNH_2^+$), a phenethylammonium cation (i.e., $C_6H_5CH_2CH_2NH_3^+$), or a guanidinium cation (i.e., $CH_6N_3^+$). An example of the alkali metal cation is a cesium cation (i.e., $Cs^+$). It is desirable that the monovalent cation located at the A site is a formamidinium cation. The monovalent cation located at the A site may be composed of two or more kinds of the cations. An example of the halogen anion located at the X site is an iodide ion. The halogen anion located at the X site may be composed of two or more kinds of the halogen ions.

The light-absorbing layer 4 may contain a material other than the light-absorbing material. For example, the light-absorbing layer 4 further may contain a quencher material to lower a defect density of the perovskite compound represented by the chemical formula $ASnX_3$. An example of the quencher material is a fluorine compound such as tin fluoride.

The electron transport layer 3 contains an electron transport material including Ti and Zn. The electron transport material including Ti and Zn is appropriate in terms of the matching of the energy level of the conduction band of the perovskite compound represented by the chemical formula $ASnX_3$. In particular, a difference between the energy level of the lower end of the conduction band of the electron transport material including Ti and Zn and the energy level of the lower end of the conduction band of the perovskite compound represented by the chemical formula $ASnX_3$ is a small value of less than 0.42 eV. The difference may be not more than 0.23 eV, not more than 0.09 eV, or not more than 0.01 eV.

On the basis of the vacuum level, the energy level of the lower end of the conduction band of the electron transport material including Ti and Zn may be more than −3.89 eV and less than −3.05 eV. The energy level may be not less than −3.46 eV and not more than −3.24 eV.

The electron transport material including Ti and Zn may be a material represented by the chemical formula $Ti_xZn_{1-x}O_{1+x}$ (where 0<x<1). In this chemical formula, the value of x may be not less than 0.20 and not more than 0.73.

The electron transport layer 3 may be in contact with the light-absorbing layer 4. The electron transport layer 3 does not have to be in contact with the light-absorbing layer 4. In a case where the electron transport layer 3 is in contact with the light-absorbing layer 4, the electron transport material including Ti and Zn may be provided on a surface of the electron transport layer 3 which is in contact with the light-absorbing layer 4. The electron transport layer 3 may contains a plurality of the electron transport materials. The electron transport layer 3 may be composed of a plurality of the layers formed of electron transport materials which are different from each other. In a case where the electron transport layer 3 is composed of a plurality of the layers, for example, a layer which is in contact with the light-absorbing layer 4 contains the electron transport material including Ti and Zn.

In the solar cell 100 shown in FIG. 1, the first electrode 2, the electron transport layer 3, the light-absorbing layer 4, a hole transport layer 5, and the second electrode 6 are stacked on a substrate 1 in this order. The solar cell 100 does not have to have the substrate 1. The solar cell 100 does not have to have the hole transport layer 5.

Next, the fundamental function effect of the solar cell 100 will be described. When the solar cell 100 is irradiated with light, the light-absorbing layer 4 absorbs the light to generate excited electrons and holes. The excited electrons migrate to the electron transport layer 3. On the other hand, the holes generated in the light-absorbing layer 4 migrate to the hole transport layer 5. The electron transport layer 3 and the hole transport layer 5 are electrically connected with the first electrode 2 and the second electrode 6, respectively. Electric current is taken out from the first electrode 2 and the second electrode 6 which serves as the anode and the cathode, respectively.

The solar cell 100 is produced, for example, by the following method.

First, the first electrode 2 is formed on the surface of the substrate 1 by a chemical vapor deposition method (hereinafter, referred to as "CVD method") or by a sputtering method.

Next, the electron transport layer 3 is formed on the first electrode 2 by an application method such as a spin-coat method or by a sputtering method. The electron transport layer 3 contains the electron transport material including Ti and Zn. If the electron transport layer 3 is formed by a spin-coat method, a solution in which a Ti starting material and a Zn starting material have been dissolved in a solvent at a predetermined ratio is applied on the first electrode 2 by a spin-coat method. In this way, a film is formed. The film may be sintered in air at a predetermined temperature (e.g., not less than 300 degrees Celsius and not more than 500 degrees Celsius). An example of the Ti starting material is titanium tetraisopropoxide or $TiCl_4$. An example of the Zn starting material is $ZnCl_2$ or zinc acetate. An example of the solvent is isopropanol or ethanol.

The light-absorbing layer 4 is formed on the electron transport layer 3. The light-absorbing layer 4 may be formed by the following method. As one example, a formation method of the light-absorbing layer 4 containing the perovskite compound represented by the chemical formula (HC $(NH_2)_2)_{1-y}(C_6H_5CH_2CH_2NH_3)_ySnI_3$ (where $0<y<1$, hereinafter, referred to as "$FA_{1-y}PEA_ySnI_3$") will be described.

First, $SnI_2$, $HC(NH_2)_2I$ (hereinafter, referred to as "FAI"), and $C_6H_5CH_2CH_2NH_3I$ (hereinafter, referred to as "PEAI") are added to an organic solvent to provide a mixture solution. An example of the organic solvent is a mixture liquid of dimethylsulfoxide and N, N-dimethylformamide (hereinafter, referred to as "DMSO" and "DMF", respectively, the volume ratio of DMSO:DMF=1:1). The molar concentration of $SnI_2$ may be not less than 0.8 mol/L and not more than 2.0 mol/L, or not less than 0.8 mol/L and not more than 1.5 mol/L. The molar concentration of FAI may be not less than 0.8 mol/L and not more than 2.0 mol/L, or not less than 0.8 mol/L and not more than 1.5 mol/L. The molar concentration of PEAI may be not less than 0.1 mol/L and not more than 0.3 mol/L, or not less than 0.1 mol/L and not more than 0.5 mol/L.

Next, the mixture solution is heated with a heater to a temperature of not less than 40 degrees Celsius and not more than 180 degrees Celsius. In this way, a mixture solution in which $SnI_2$, FAI, and PEAI have been dissolved is provided. Subsequently, the provided mixture solution is left at rest at room temperature.

The mixture solution is applied on the electron transport layer 3 by a spin-coat method, and then, heated at temperature of not less than 40 degrees Celsius and not more than 100 degrees Celsius for not less than 15 minutes and not more than 1 hour. In this way, the light-absorbing layer 4 is provided. In a case where the mixture solution is applied by a spin-coat method, drops of a poor solvent may be put during the spin-coat. An example of the poor solvent is toluene, chlorobenzene, or diethyl ether.

The mixture solution may contain the quencher material such as tin fluoride. The concentration of the quencher material may be not less than 0.05 mol/L and not more than 0.4 mol/L. The quencher material prevents defects from being generated in the light-absorbing layer 4, namely, prevents Sn holes from being generated. The increase in the $Sn^{4+}$ promotes the generation of the Sn holes.

The hole transport layer 5 is formed on the light-absorbing layer 4. An example of the formation method of the hole transport layer 5 is an application method or a printing method. An example of the application method is a doctor blade method, a bar coating method, a spray method, a dip coating method, or a spin-coat method. An example of the printing method is a screen printing method. A plurality of the materials may be mixed to provide the hole transport layer 5, and then, the hole transport layer 5 may be pressurized or sintered. In a case where the hole transport layer 5 is formed of an organic low molecular material or an inorganic semiconductor, the hole transport layer 5 may be formed by a vacuum deposition method.

Next, the second electrode 6 is formed on the hole transport layer 5. In this way, the solar cell 100 is provided. The second electrode 6 may be formed by a CVD method or by a sputtering method.

Hereinafter, the elements of the solar cell 100 will be described in more detail.

(Substrate 1)

The substrate 1 holds the first electrode 2, the electron transport layer 3, the light-absorbing layer 4, and the second electrode 6. The substrate 1 may be formed of a transparent material. An example of the substrate 1 is a glass substrate or a plastic substrate. An example of the plastic substrate is a plastic film. In a case where the first electrode 2 has sufficient strength, the solar cell 100 does not have to have the substrate 1, since the first electrode 2 holds the electron transport layer 3, the light-absorbing layer 4, and the second electrode 6.

(First Electrode 2 and Second Electrode 6)

The first electrode 2 and the second electrode 6 have electric conductivity. At least one of the first electrode 2 and the second electrode 6 has light-transmissive property. Light from visible region to near-infrared light region may travel through the electrode having the light-transmissive property. The electrode having the light-transmissive property may be formed of at least one of a metal oxide or a metal nitride having both the transparency and the light-transmissive property.

An example of the metal oxide is:

(i) titanium oxide doped with at least one selected from the group consisting of lithium, magnesium, niobium, and fluorine;

(ii) gallium oxide doped with at least one selected from the group consisting of tin and silicon;

(iii) indium-tin composite oxide;

(iv) tin oxide doped with at least one selected from the group consisting of antimony and fluorine; or (v) zinc oxide doped with at least one selected from the group consisting of boron, aluminum, gallium, and indium.

Two or more kinds of the metal oxides may be used in combination as a composite.

An example of the metal nitride is a gallium nitride doped with at least one selected from the group consisting of silicon and oxygen. Two or more kinds of the metal nitrides may be used in combination.

The metal oxide and the metal nitride may be used in combination.

The first electrode 2 may be formed by providing a pattern through which light passes using a non-transparent material. An example of the pattern through which the light passes is a line, a wave, a grid, or a punching metal pattern on which a lot of fine through holes are arranged regularly or irregularly. When the first electrode 2 has the above-mentioned pattern, light can travel through a part in which an electrode material is absent. An example of the non-transparent material is platinum, gold, silver, copper, aluminum, rhodium, indium, titanium, iron, nickel, tin, zinc, or alloy containing at least two selected therefrom. An electrically-conductive carbon material may be used as the non-transparent material.

The solar cell 100 comprises the electron transport layer 3 between the light-absorbing layer 4 and the first electrode 2. For this reason, the first electrode 2 does not have to block the holes which migrate from the light-absorbing layer 4. Therefore, the first electrode 2 may be formed of a material capable of forming ohmic contact with the light-absorbing layer 4.

In a case where the solar cell 100 does not comprise the hole transport layer 5, the second electrode 6 is formed of a material having an electron block property that the electrons migrating from the light-absorbing layer 4 are blocked. In this case, the second electrode 6 is not in ohmic contact with the light-absorbing layer 4. The electron block property that the electrons migrating from the light-absorbing layer 4 are blocked means that only the holes generated in the light-absorbing layer 4 are allowed to be passed; however, the electron are not allowed to be passed. The Fermi energy level of the material having the electron block property is lower than the energy level of the lower end of the conduction band of the light-absorbing layer 4. The Fermi energy level of the material having the electron block property may be lower than the Fermi energy level of the light-absorbing layer 4. In particular, the second electrode 6 may be formed of platinum, gold, or a carbon material such as graphene. These materials have the electron block property; however, does not have the light-transmissive property. Therefore, in a case where the second electrode 6 having the light-transmissive property is formed using these materials, as described above, the second electrode 6 having the pattern through which the light passes is formed. In a case where the solar cell 100 comprises the hole transport layer 5 between the light-absorbing layer 4 and the second electrode 6, the second electrode 6 does not have to have the electron block property that the electrons migrating from the light-absorbing layer 4 are blocked. Therefore, the second electrode 6 may be formed of a material capable of being in ohmic contact with the light-absorbing layer 4.

The transmissivity of the light of the first electrode 2 and the second electrode 6 may be 50% or more, or 80% or more. The wavelength of the light which travels through the electrode depends on an absorption wavelength of the light-absorbing layer 4. Each of the first electrode 2 and the second electrode 6 has a thickness of, for example, not less than 1 nanometer and not more than 1,000 nanometers.

(Electron Transport Layer 3)

The electron transport layer 3 contains the electron transport material including Ti and Zn, as described above.

The electron transport layer 3 may contain an electron transport material other than the electron transport material including Ti and Zn. In this case, the electron transport layer 3 may be composed of a plurality of the layers formed of electron transport materials which are different from each other. In a case where the electron transport layer 3 is composed of the plurality of the layers, for example, the layer in contact with the light-absorbing layer 4 contains the electron transport material including Ti and Zn.

The electron transport material other than the electron transport material including Ti and Zn may be a material known as an electron transport material of a solar cell. The known material may be a semiconductor having a bandgap of not less than 3.0 eV. In a case where the electron transport layer 3 includes a semiconductor having a bandgap of not less than 3.0 eV, visible light and infrared light reaches the light-absorbing layer 4. An example of the semiconductor is an organic or inorganic n-type semiconductor.

An example of the organic n-type semiconductor is an imide compound, a quinone compound, fullerene, or a derivative of fullerene. An example of the inorganic n-type semiconductor is a metal oxide, a metal nitride, or a perovskite compound. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the metal nitride is GaN. An example of the perovskite compound is $SrTiO_3$ or $CaTiO_3$.

The electron transport layer 3 may contain a material having a bandgap of more than 6.0 eV. An example of the material having a bandgap of more than 6.0 eV is (i) a halide of an alkali metal or alkali earth metal such as lithium fluoride or calcium fluoride, (ii) an alkali metal oxide such as magnesium oxide, or (iii) silicon dioxide. In this case, the electron transport layer 3 has a thickness of, for example, not more than 10 nanometers to ensure the electron transport property of the electron transport layer 3.

(Light-Absorbing Layer 4)

The light-absorbing layer 4 contains the perovskite compound represented by the chemical formula $ASnX_3$, as described above. The light-absorbing layer 4 may mainly contain the perovskite compound represented by the chemical formula $ASnX_3$. The sentence "The light-absorbing layer 4 mainly contains the perovskite compound represented by the chemical formula $ASnX_3$" means that the light-absorbing layer 4 contains 70 mass percent or more of the perovskite compound represented by the chemical formula $ASnX_3$. The light-absorbing layer 4 may contain 80 mass percent or more of the perovskite compound represented by the chemical formula $ASnX_3$. The light-absorbing layer 4 may contain a compound other than the perovskite compound represented by the chemical formula $ASnX_3$. The light-absorbing layer 4 may contain impurities.

The light-absorbing layer 4 has a thickness of, for example, not less than 100 nanometers and not more than 10 micrometers. The light-absorbing layer 4 may have a thickness of not less than 100 nanometers and not more than 1,000 nanometers. The thickness of the light-absorbing layer 4 may depend on the magnitude of the light-absorbing of the light-absorbing layer 4. The light-absorbing layer 4 may be formed by an application method using a solution.

(Hole Transport Layer 5)

The hole transport layer 5 is composed of an organic substance or an inorganic semiconductor. An example of a general organic substance used for the hole transport layer 5 is 2,2',7,7'-tetrakis-(N,N-di-p-methoxyphenylamine)9,9'-spirobifluorene (hereinafter, referred to as "spiro-OMeTAD"), poly[bis(4-phenyl)(2,4,6-trimethylphenyl) amine] (hereinafter, referred to as "PTAA"), poly(3-hexylthiophene-2,5-diyl) (hereinafter, referred to as "P3HT"), poly(3,4-ethylenedioxythiophene) (hereinafter, referred to as "PEDOT"), or copper phthalocyanine (hereinafter, referred to as "CuPC").

An example of the inorganic semiconductor is $Cu_2O$, $CuGaO_2$, CuSCN, CuI, $NiO_x$, $MoO_x$, $V_2O_5$, or a carbon material such as a graphene oxide.

The hole transport layer 5 may include a plurality of layers formed of materials which are different from each other.

The hole transport layer 5 may have a thickness of not less than 1 nanometer and not more than 1,000 nanometers, not less than 10 nanometers and not more than 500 nanometers, or not less than 10 nanometers and not more than 50 nanometers. If the hole transport layer 5 has a thickness of not less than 1 nanometer and not more than 1,000 nanometers, a sufficient hole transport property is achieved. Furthermore, if the hole transport layer 5 has a thickness of not less than 1 nanometer and not more than 1,000 nanometers, light is converted into electric power with high efficiency, since the hole transport layer 5 has low resistance.

The hole transport layer 5 may contain an supporting electrolyte and a solvent. The supporting electrolyte and the solvent stabilize the holes included in the hole transport layer 5.

An example of the supporting electrolyte is an ammonium salt or an alkali metal salt. An example of the ammonium salt is tetrabutylammonium perchlorate, tetraethylammonium hexafluorophosphate, an imidazolium salt, or a pyridinium salt. An example of the alkali metal salt is lithium bis (trifluoromethanesulfonyl)imide (hereinafter, referred to as "LiTFSI"), $LiPF_6$, $LiBF_4$, lithium perchlorate, or potassium tetrafluoroborate.

The solvent contained in the hole transport layer 5 may have high ionic conductivity. The solvent may be an aqueous solvent or an organic solvent. It is desirable that the solvent is an organic solvent, in light of stabilization of the solute. An example of the organic solvent is tert-butyl pyridine, pyridine, or a heterocyclic compound such as n-methylpyrrolidone.

The solvent contained in the hole transport layer 5 may be an ionic liquid. The ionic liquid may be used solely or in combination of another solvent. The ionic liquid is desirable in light of low volatility and high flame resistance.

An example of the ionic liquid is an imidazolium compound such as 1-ethyl-3-methylimidazolium tetracyanoborate, a pyridine compound, an alicyclic amine compound, an aliphatic amine compound, or an azonium amine compound.

Figure 2:
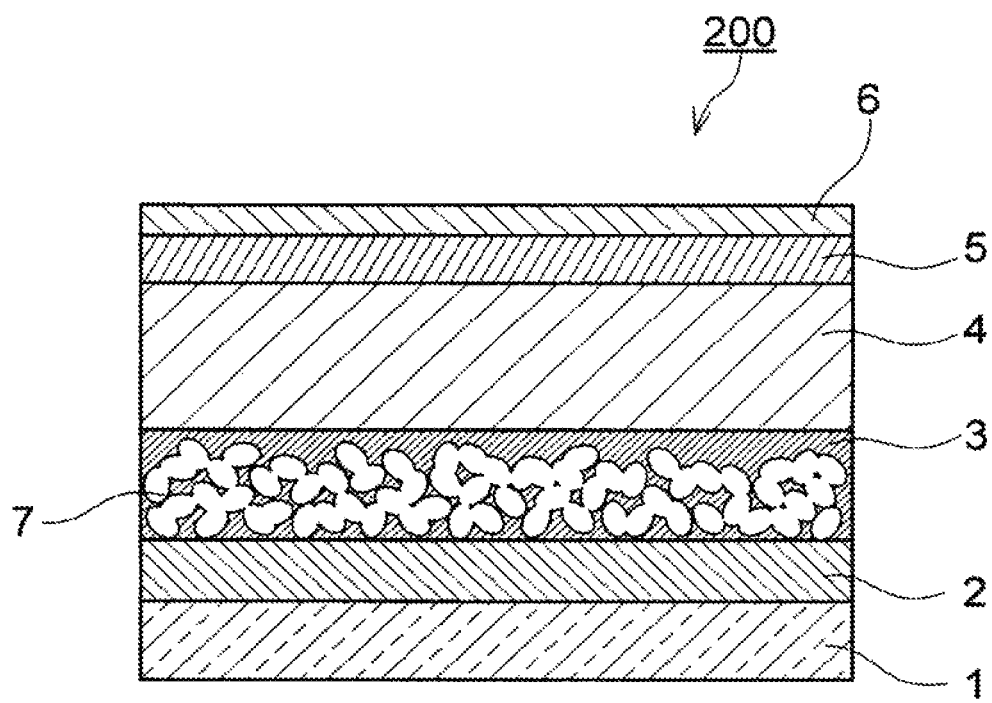
FIG. 2 shows a cross-sectional view of a variation of the solar cell according to the embodiment of the present disclosure.

FIG. 2 shows a cross-sectional view of a variation of the solar cell 200 according to the embodiment. Unlike the solar cell 100 shown in FIG. 1, the solar cell 200 comprises a porous layer 7.

In the solar cell 200 shown in FIG. 2, the first electrode 2, the porous layer 7, the electron transport layer 3, the light-absorbing layer 4, the hole transport layer 5, and the second electrode 6 are stacked in this order on the substrate 1. The porous layer 7 includes a porous material. The porous material includes a pore. The solar cell 200 does not have to have the substrate 1. The solar cell 200 does not have to have the hole transport layer 5.

The pore included in the porous layer 7 communicates from a part in contact with the first electrode 2 to a part in contact with the electron transport layer 3. The pore included in the porous layer 7 is filled with the material of the electron transport layer 3. Since the first electrode 2 is in contact with the electron transport layer 3, electrons migrate directly from the electron transport layer 3 to the first electrode 2.

Next, the fundamental functional effect of the solar cell 200 will be described. When the solar cell 200 is irradiated with light, the light-absorbing layer 4 absorbs the light to generate the excited electrons and holes. The excited electrons migrate to the electron transport layer 3. On the other hand, the holes generated in the light-absorbing layer 4 migrate to the hole transport layer 5. As described above, since the electron transport layer 3 and the hole transport layer 5 are electrically connected to the first electrode 2 and the second electrode 6, respectively, electric current is taken out from the first electrode 2 and the second electrode 6 which serve as the anode and the cathode, respectively.

The porous layer 7 facilitates the formation of the light-absorbing layer 4. The electron transport layer 3 formed on the porous layer 7 may cover a surface and a pore wall of the porous layer 7. Since the electron transport layer 3 has a small thickness, shapes of the surface and the pore of the porous layer 7 are maintained. In this case, the material of the light-absorbing layer 4 enters the inside of the pore of the porous layer 7 covered with the electron transport layer 3. For this reason, the possibility that the material of the light-absorbing layer 4 is repelled or aggregated on the surface of the electron transport layer 3 is lowered. The porous layer 7 is a foothold of the light-absorbing layer 4. The porous layer 7 allows the light-absorbing layer 4 to be formed as a uniform film. The light-absorbing layer 4 may be formed by applying a solution on the electron transport layer 3 by a spin-coat method, and then, heating.

The porous layer 7 causes light scattering. For this reason, length of a path of light which travel thorough the light-absorbing layer 4 may be increased. The increase in the path of light may increase amounts of the electrons and holes which are generated in the light-absorbing layer 4.

The solar cell 200 may be produced by a method similar to that of the solar cell 100. The porous layer 7 is formed on the first electrode 2, for example, by an application method.

(Porous Layer 7)

The porous layer 7 is a foothold for the formation of the light-absorbing layer 4. The porous layer 7 does not prevent the electrons from migrating from the light-absorbing layer 4 to the first electrode 2.

The porous layer 7 contains the porous material. An example of the porous material is a porous material in which insulative or semiconductor particles are connected. An example of the material of the insulative particles is aluminum oxide or silicon oxide. An example of the material of the semiconductor particles is an inorganic semiconductor. The example of the inorganic semiconductor is a metal oxide (including a perovskite oxide), a metal sulfide, or a metal chalcogenide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the perovskite oxide is $SrTiO_3$ or $CaTiO_3$. An example of the metal sulfide is CdS, ZnS, $In_2S_3$, SnS, PbS, $Mo_2S$, $WS_2$, $Sb_2S_3$, $Bi_2S_3$, $ZnCdS_2$, or $Cu_2S$. An example of the metal chalcogenide is CdSe, CsSe, $In_2Se_3$, $WSe_2$, HgS, SnSe, PbSe, or CdTe.

The porous layer 7 may have a thickness of not less than 0.01 micrometer and not more than 10 micrometers, or not less than 0.1 micrometer and not more than 1 micrometer. The porous layer 7 may have a large surface roughness. In particular, a surface roughness coefficient defined by a value of an effective area/a projected area may be not less than 10, or not less than 100. The effective area is an actual area of a surface of the object. The projected area is an area of a shadow of an object formed posteriorly to the object when light travelling from the front of the object is incident on the object. The effective area can be calculated from a volume calculated from the projected area and the thickness of the object, a specific surface area of the material which constitutes the object, and a bulk density of the object. The specific surface area is measured, for example, by a nitrogen adsorption method.

EXAMPLES

The present disclosure will be described in more detail with reference to the following examples.

Inventive Example 1

In the inventive example 1, the tin perovskite solar cell 200 shown in FIG. 2 was produced as below.

A glass substrate having a $SnO_2$ layer doped with indium on the surface thereof was prepared. The glass substrate was a product of Nippon Sheet Glass Company, Ltd. The glass substrate and the $SnO_2$ layer served as the substrate 1 and the first electrode 2. The glass substrate had a thickness of 1 millimeter.

Highly pure titanium oxide powder having a mean primary particle diameter of 30 nanometers was dispersed in ethyl cellulose to prepare a titanium oxide paste.

The prepared titanium oxide paste was applied to the first electrode 2 by screen printing method, and then, the paste was dried. Subsequently, the titanium oxide paste was sintered in air at temperature of 500 degrees Celsius for 30 minutes to form the porous layer 7 composed of a porous titanium oxide layer having a thickness of 0.2 micrometers.

Next, an isopropanol solution containing titanium tetraisopropoxide (hereinafter, referred to as "TTIT") and $ZnCl_2$ was prepared. The isopropanol solution had a TTIT concentration and a $ZnCl_2$ concentration of 10.6 mmol/L and 3.9 mmol/L, respectively. The isopropanol solution (80 microliters) was applied on the porous layer 7 by a spin-coat method, and then, sintered in air at 350 degrees Celsius for 1 hour. In this way, the electron transport layer 3 formed of $Ti_{0.73}Zn_{0.27}O_{1.73}$ was formed. The electron transport layer 3 had a thickness of approximately 10 nanometers. The composition $Ti_{0.73}Zn_{0.27}O_{1.73}$ of the electron transport material of the electron transport layer 3 was determined on the basis of a ratio of Ti to Zn contained in the isopropanol solution. The composition of the electron transport material of the electron transport layer 3 may be determined on the basis of a result of X-ray photoemission spectroscopy measurement of the electron transport layer 3.

Next, $SnI_2$, $SnF_2$, FAI (i.e., $HC(NH_2)_2I$), and PEAI (i.e., $C_6H_5CH_2CH_2NH_3I$) were added to a mixture solvent of DMSO and DMF to provide a mixture solution. A volume ratio of DMSO:DMF in the mixture solvent was 1:1. The concentration of $SnI_2$, $SnF_2$, FAI, and PEAI were 1.5 mol/L, 0.15 mol/L, 1.5 mol/L, and 0.3 mol/L, respectively.

In a globe box, the mixture solution (80 microliters) was applied on the electron transport layer 3 by a spin-coat method to provide an application film having a thickness of 500 nanometers. Then, the application film was sintered on a hot plate at 80 degrees Celsius to form the light-absorbing layer 4. The light-absorbing layer 4 contained the perovskite compound of the chemical formula $FA_{0.83}PEA_{0.17}SnI_3$ mainly. On the basis of the vacuum level, the energy level of the lower end of the conduction band of the perovskite compound of the chemical formula $FA_{0.83}PEA_{0.17}SnI_3$ was -3.47 eV. The energy level of the lower end of the conduction band of the perovskite compound was measured similarly by a measurement method of the energy level of the lower end of the conduction band of the electron transport material. The measurement method will be described later.

Next, in the globe box, a toluene solution (80 microliters) containing PTAA (i.e., poly[bis(4-phenyl)(2,4,6-trimethylphenyl)amine]) at a concentration of 10 milligrams/milliliter was applied on the light-absorbing layer 4 by a spin-coat method to form the hole transport layer 5 having a thickness of 10 nanometers.

Finally, a gold film having a thickness of 100 nanometers was deposited on the hole transport layer 5 to form the second electrode 6. In this way, the tin perovskite solar cell according to the inventive example 1 was provided.

Inventive Example 2

In the inventive example 2, the tin perovskite solar cell 200 was provided similarly to the inventive example 1, except for the following matter (i).

(i) the concentration of TTIT and $ZnCl_2$ contained in the isopropanol solution was 6.5 mmol/L and 8.0 mmol/L, respectively.

In the inventive example 2, the electron transport layer 3 was formed of $Ti_{0.45}Zn_{0.55}O_{1.45}$. The composition $Ti_{0.45}Zn_{0.55}O_{1.45}$ of the electron transport material of the electron transport layer 3 was determined on the basis of the ratio of Ti to Zn contained in the isopropanol solution.

Inventive Example 3

In the inventive example 3, the tin perovskite solar cell 200 was provided similarly to the inventive example 1, except for the following matter (i).

(i) the concentration of TTIT and $ZnCl_2$ contained in the isopropanol solution was 3.0 mmol/L and 11.5 mmol/L, respectively.

In the inventive example 3, the electron transport layer 3 was formed of $Ti_{0.21}Zn_{0.79}O_{1.21}$. The composition $Ti_{0.21}Zn_{0.79}O_{1.21}$ of the electron transport material of the electron transport layer 3 was determined on the basis of the ratio of Ti to Zn contained in the isopropanol solution.

Comparative Example 1

In the comparative example 1, the tin perovskite solar cell 200 was provided similarly to the inventive example 1, except for the following matter (i).

(i) the concentration of TTIT and $ZnCl_2$ contained in the isopropanol solution was 14.5 mmol/L and 0 mmol/L, respectively. In other words, in the comparative example 1, $ZnCl_2$ was not used.

In the comparative example 1, the electron transport layer 3 was formed of $TiO_2$.

Comparative Example 2

In the comparative example 2, the tin perovskite solar cell 200 was provided similarly to the inventive example 1, except for the following matter (i).

(i) the concentration of TTIT and $ZnCl_2$ contained in the isopropanol solution was 0 mmol/L and 14.5 mmol/L, respectively. In other words, in the comparative example 2, TTIT was not used.

In the comparative example 2, the electron transport layer 3 was formed of ZnO.

(Measurement Method of Energy Level of Lower End of Conduction Band of Electron Transport Material)

The energy level of the lower end of the conduction band of the electron transport material of the electron transport layer 3 was calculated on the basis of ultraviolet electron spectroscopy measurement and transmissivity measurement. In particular, a stacking structure of the substrate 1, the first electrode 2, and electron transport layer 3 was used as a sample for measurement. The sample for measurement did not comprise the light-absorbing layer 4, the hole transport layer 5, or the second electrode 6. In other words, the sample for measurement had the electron transport layer 3 on the surface thereof.

The sample for measurement was subjected to the ultraviolet electron spectroscopy measurement using an ultraviolet electron spectroscopy measurement device (product of ULVAC-PHI, Inc., trade name: PHI 5000 VersaProbe) to calculate the energy level of an upper end of a valence band of the electron transport material.

The sample for measurement was subjected to the transmissivity measurement using a transmissivity measurement device (product of Shimadzu Corporation, trade name: SlidSpec-3700). The bandgap of the electron transport material was calculated on the basis of the result of the transmissivity measurement.

The energy level of the lower end of the conduction band of the electron transport material was calculated on the basis of the energy level of the upper end of the valence band and the bandgap.

Figure 3:
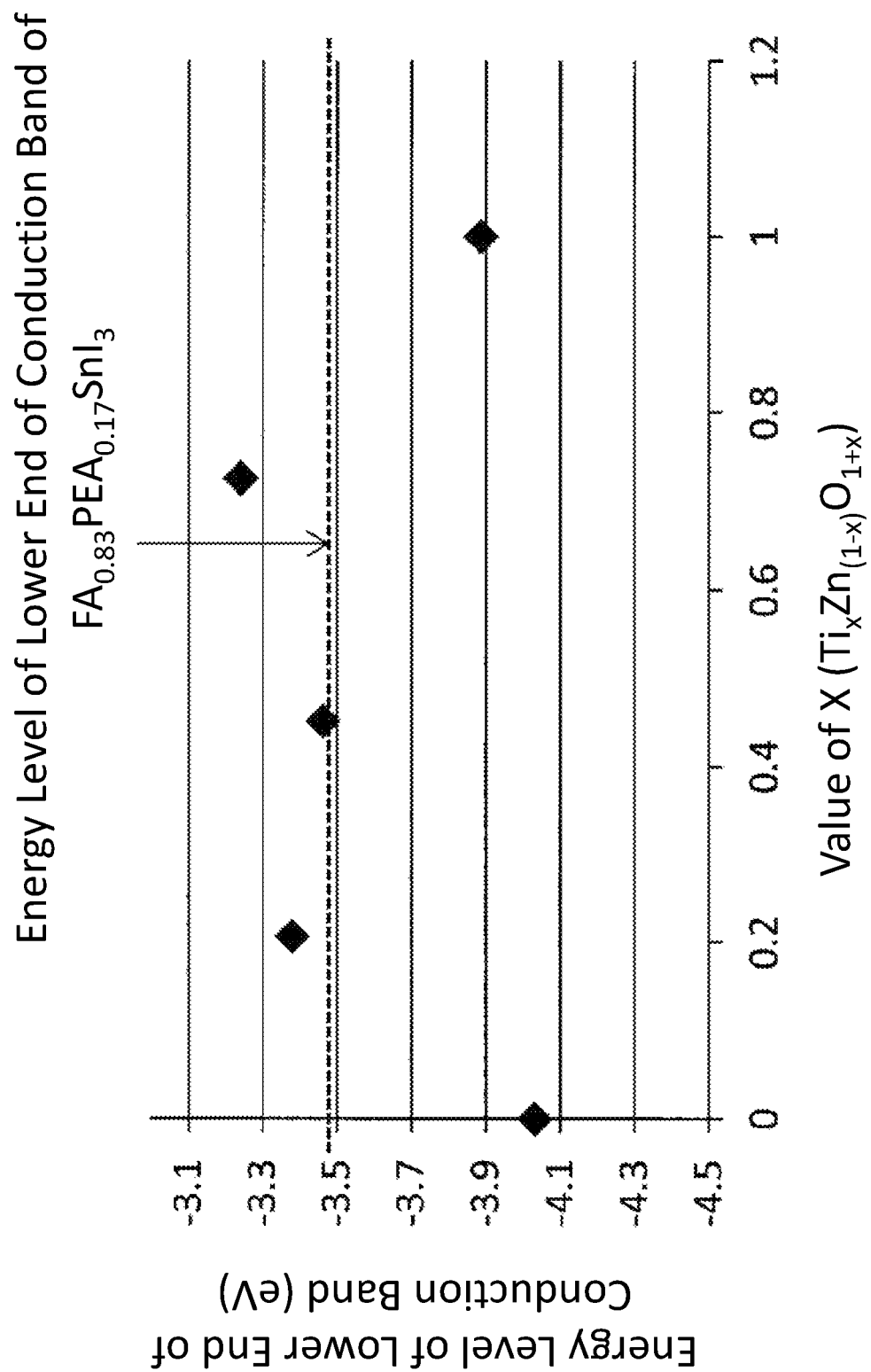
FIG. 3 is a graph showing a relation between the value of x included in the chemical formula $Ti_xZn_{1-x}O_{1+x}$ of an electron transport material included in solar cells according to the inventive examples and the comparative examples and energy levels of lower ends of conduction bands of the electron transport materials.

FIG. 3 is a graph showing a relation between the value of x included in the chemical formula $Ti_xZn_{1-x}O_{1+x}$ of the electron transport material and energy levels of lower ends of conduction bands of the electron transport materials.

(Conversion Efficiency)

Figure 4:
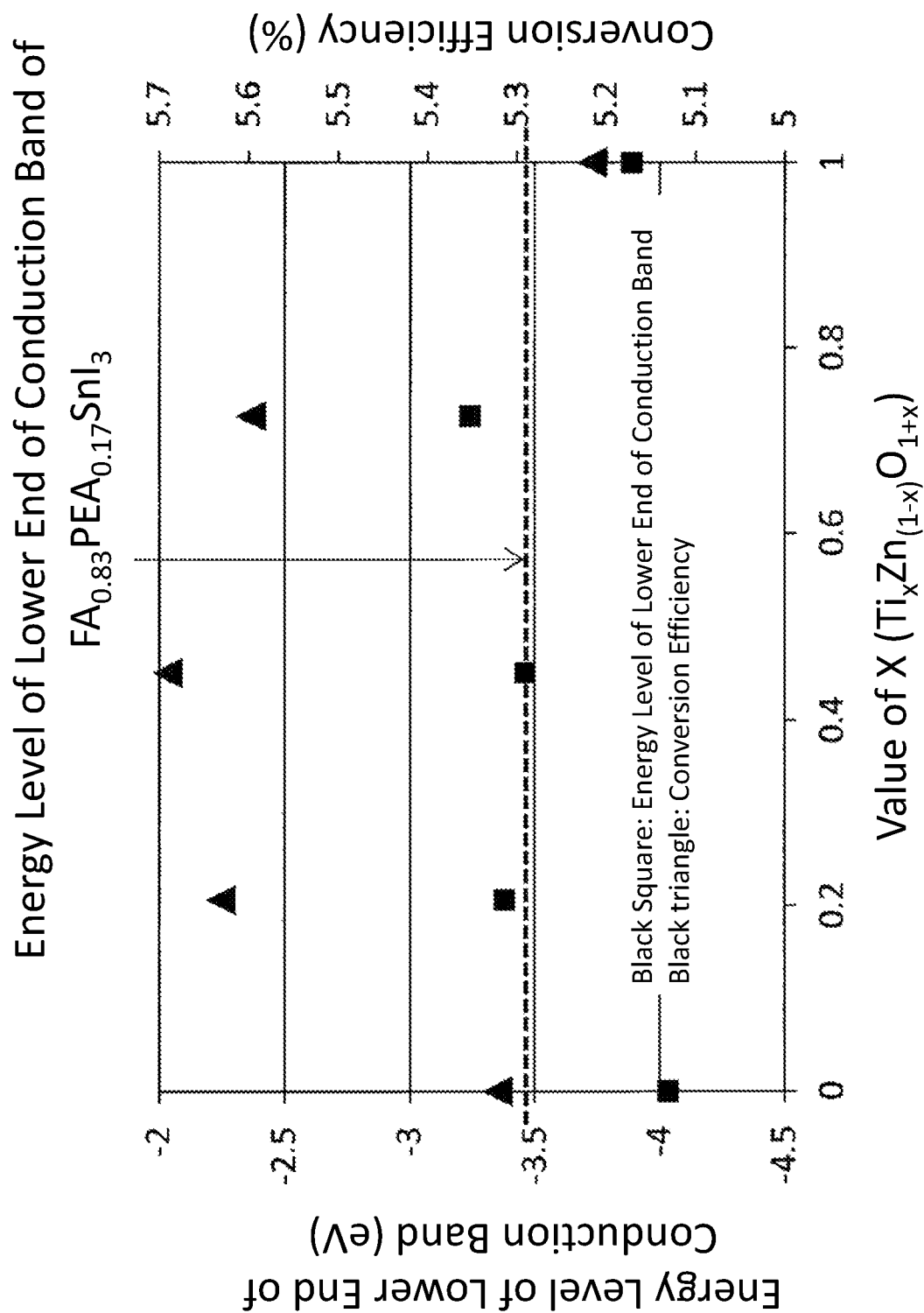
FIG. 4 is a graph showing a relation among the value of x included in the chemical formula $Ti_xZn_{1-x}O_{1+x}$ of the electron transport material included in the solar cells according to the inventive examples and the comparative examples, the energy levels of the lower ends of the conduction bands of the electron transport materials, and conversion efficiency of the solar cells.

The tin perovskite solar cells 200 according to the inventive examples 1-3 and the comparative examples 1-2 were irradiated with pseudo sunlight having an illuminance of 100 $mW/cm^2$ using a solar simulator, and then, conversion efficiency of each of the tin perovskite solar cells 200 was calculated. Table 1 shows the calculation results. FIG. 4 is a graph showing a relation among the value of x included in the chemical formula $Ti_xZn_{1-x}O_{1+x}$ of the electron transport material, the energy level of the lower end of the conduction band of the electron transport material, and the conversion efficiency of the solar cells.

TABLE 1

| | The Value of X included in the chemical formula $Ti_xZn_{1-x}O_{1+x}$ | Energy level of Lower End of Conduction Band of Electron Transport Material (eV) | Conversion Efficiency (%) |
|---|---|---|---|
| Comparative Example 1 | 1 | −3.89 | 5.22 |
| Inventive Example 1 | 0.73 | −3.24 | 5.56 |
| Inventive Example 2 | 0.45 | −3.46 | 5.7 |
| Inventive Example 3 | 0.21 | −3.38 | 5.63 |
| Comparative Example 2 | 0 | −4.03 | 5.32 |

As shown in Table 1 and FIG. 4, in the tin perovskite solar cells 200 according to the inventive examples 1-3, the difference between the energy level of the lower end of the conduction band of the electron transport material of the electron transport layer 3 and the energy level (namely, −3.47 eV) of the lower end of the conduction band of the perovskite compound contained in the light-absorbing layer 4 was less than 0.42 eV. On the other hand, in the tin perovskite solar cells 200 according to the comparative examples 1-2, the difference was not less than 0.42 eV. The tin perovskite solar cells 200 according to the inventive examples 1-3 have higher conversion efficiency than the tin perovskite solar cells 200 according to the comparative examples 1-2.

INDUSTRIAL APPLICABILITY

The solar cell according to the present disclosure is disposed, for the example, on a roof.

REFERENTIAL SIGNS LIST

1 Substrate
2 First electrode
3 Electron transport layer
4 Light-absorbing layer
5 Hole transport layer
6 Second electrode
7 Porous layer
100, 200 Solar cell

The invention claimed is:

1. A solar cell, comprising:
a first electrode;
a second electrode;
a light-absorbing layer located between the first electrode and the second electrode; and
an electron transport layer located between the first electrode and the light-absorbing layer, wherein:
at least one electrode selected from the group consisting of the first electrode and the second electrode has light-transmissive property,
the light-absorbing layer contains a perovskite compound represented by a chemical formula $FA_{1-y}PEA_ySnI_3$, where FA denotes a formamidinium cation, PEA denotes a phenethylammonium cation, and 0<y<1,
the electron transport layer contains an electron transport material including Ti and Zn, and the electron transport material is formed of an oxide represented by the chemical formula $Ti_xZn_{1-x}O_{1+x}$, where 0<x<1, and
a difference between an energy level of a lower end of conduction band of the electron transport material and an energy level of a lower end of conduction band of the perovskite compound is less than 0.42 eV.

2. The solar cell according to claim 1, wherein
on the basis of a vacuum level, the energy level of the lower end of the conduction band of the electron transport material is more than −3.89 eV and less than −3.05 eV.

3. The solar cell according to claim 1, wherein
on the basis of a vacuum level, the energy level of the lower end of the conduction band of the electron transport material is not less than −3.46 eV and not more than −3.24 eV.

4. The solar cell according to claim 1, wherein
the value of x is not less than 0.20 and not more than 0.73.

5. The solar cell according to claim 1, wherein
the electron transport layer is in contact with the light-absorbing layer; and
the electron transport material is provided on a surface of the electron transport layer which is in contact with the light-absorbing layer.

6. The solar cell according to claim 1, further comprising:
a hole transport layer located between the second electrode and the light-absorbing layer.

* * * * *